United States Patent [19]

Suzuki et al.

[11] 4,210,873
[45] Jul. 1, 1980

[54] GAIN AND IMPEDANCE SWITCHING CIRCUIT FOR AN AMPLIFIER

[75] Inventors: Tadao Suzuki, Tokyo; Hirohito Kawada, Mitaka, both of Japan

[73] Assignee: Sony Corporation, Tokyo, Japan

[21] Appl. No.: 936,103

[22] Filed: Aug. 23, 1978

[30] Foreign Application Priority Data

Aug. 29, 1977 [JP] Japan ................. 52/115397[U]

[51] Int. Cl.² .......................................... H03G 3/14
[52] U.S. Cl. .................................... 330/51; 330/107; 330/110; 330/282; 330/294; 330/304
[58] Field of Search ................ 330/51, 86, 107, 109, 330/282, 294, 304, 110; 333/28 R, 28 T; 179/1 A, 1 D

[56] References Cited
PUBLICATIONS

Pieau, "Compact Electrometer has Automatic Range Switching," *Electronic Engineering,* Oct. 1972, pp. 71–73.

*Primary Examiner*—James B. Mullins
*Attorney, Agent, or Firm*—Hill, Van Santen, Steadman, Chiara & Simpson

[57] ABSTRACT

A gain and impedance switching circuit for an amplifier includes an AF amplifier having an input impedance connected between the input terminal thereof and a reference point and a feedback circuit connected between the feedback and output terminals of the amplifier, a first series circuit consisting of a first impedance and a first ON/OFF switch and connected between the input terminal of the AF amplifier and a reference point (such as ground) and a second series circuit consisting of a second impedance and a second ON/OFF switch connected between the feedback terminal of the AF amplifier and the reference point, the first and second ON/OFF switches being ganged with each other so as to change the input impedance and the gain of the AF amplifier simultaneously.

8 Claims, 3 Drawing Figures

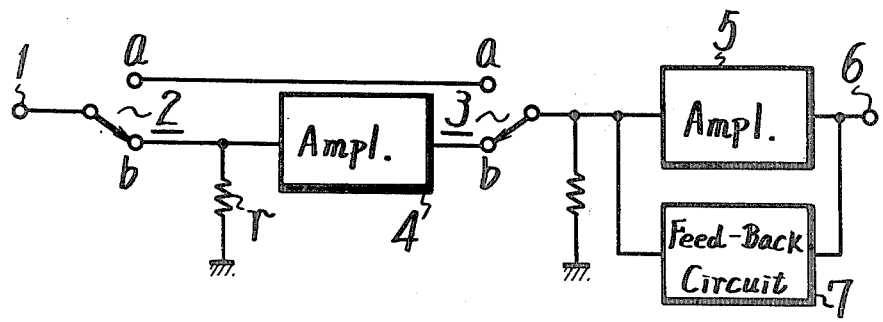
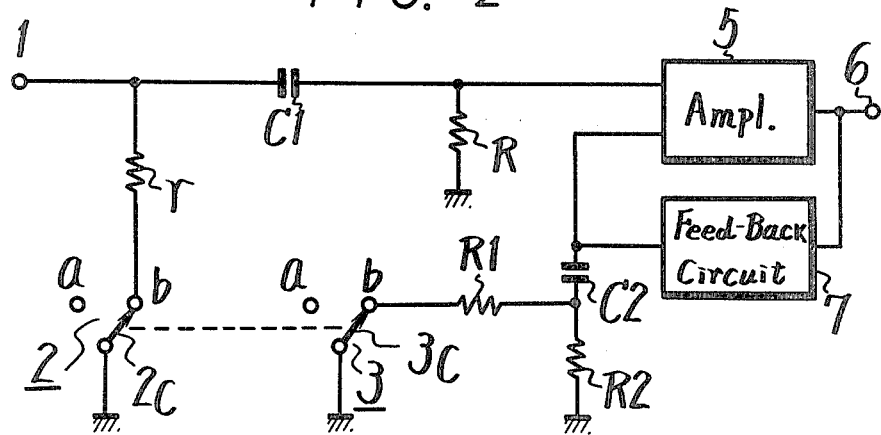
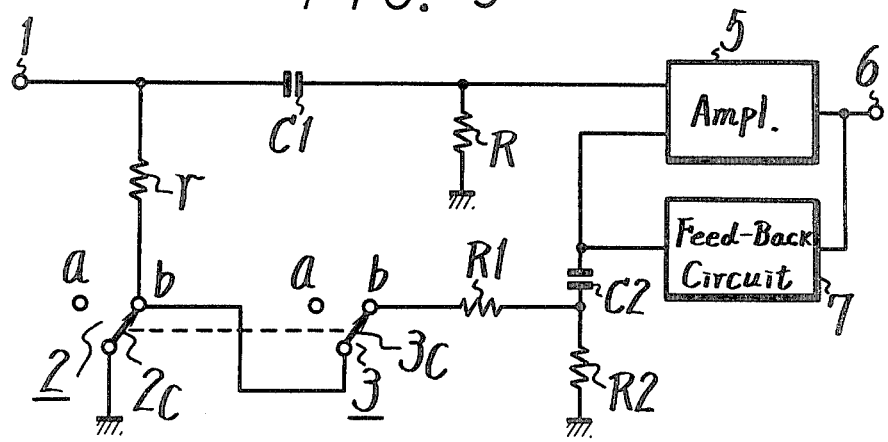

GAIN AND IMPEDANCE SWITCHING CIRCUIT FOR AN AMPLIFIER

BACKGROUND OF THE INVENTION

1. Field of the Invention

The present invention relates generally to a gain and impedance switching circuit for an amplifier, and more particularly to a gain and impedance switching circuit for an amplifier which has practically no danger of oscillating during switching operation.

2. Description of the Prior Art

In the art, when cartridges that are different in output voltage and in output impedance are selectively used, provision has been made in the past that an amplifier is so switched that its input impedance and gain correspond to those of the cartridge. This switching of the amplifier is achieved in the art by a switching circuit such as shown in FIG. 1. In FIG. 1, 1 designates an input terminal, 2 and 3 changeover switches, 4 a pre-amplifier, 5 an equalizing amplifier, 6 the input terminal of an output amplifier, and 7 a feedback circuit.

When the circuit shown in FIG. 1 is connected to a moving magnet type cartridge (which will hereinafter be referred to as an MM cartridge), the change-over switches 2 and 3 are switched to their fixed contacts a, while when connected to a moving coil tape cartridge (which will be hereinafter referred to as a MC cartridge), the switches 2 and 3 are switched to their fixed contacts b, respectively.

In general, the MM cartridge has an output of 2 to 10 mV, and its input impedance is 50 KΩ as a standard load. While the MC cartridge has an output of 0.05 to 0.5 mV and its own output impedance is low or lower than 50Ω, so that its input impedance is selected about 150Ω. If the input impedance of the MC cartridge is increased too high, a resonance is caused by the output impedance of the MC cartridge itself and the capacity of a cord connected thereto and hence there is danger that an oscillation is caused. For this reason, the input impedance of the MC cartridge is selected at most 150Ω generally.

Further, the pre-amplifier 4 has a flat frequency characteristic and the equalizing amplifier 5 has such a frequency characteristic that its output becomes low at a high band (RIAA) characteristic). The reason for this is that since a signal is recorded on a record with the signal level being high in a high band, the recording and reproducing characteristics are made average. Accordingly, in case of the MM cartridge, it is connected directly to the equalizing amplifier 5 through an input resistor R with the resistance value of 50 KΩ, while in case of the MC cartridge, it is connected through an input resistor r with the resistance value of about 150Ω to the pre-amplifier 4 for the output therefrom to be amplified at about 20 to 30 dB and then to be applied to the equalizing amplifier 5. Therefore, with the prior art switching circuit shown in FIG. 1, the pre-amplifier 4 itself causes an increase in cost, and at the same time, since the input signal to the pre-amplifier 4 is high in level as the frequency becomes high, the tolerant input of the whole amplifier is limited by the maximum output of the pre-amplifier 4 at the high band.

SUMMARY OF THE INVENTION

Accordingly, a first object of the present invention is to provide a gain and impedance switching circuit for an amplifier free from the defects inherent in the prior type of circuit as described above.

Another object of the invention is to provide a gain and impedance switching circuit for an amplifier which eliminates the objections above referred to, and removes any fear that the amplifier might be placed into oscillation upon switching of the gain and impedance.

A further object of the invention is to provide a novel gain and impedance switching circuit for an amplifier suitable for such a case in which MM and MC cartridges are selectively used.

In accordance with one aspect of the present invention, there is provided a gain and impedance switching circuit for an amplifier which comprises an amplifier havig input, feedback and output terminals, a feedback circuit having first and second impedances the first impedance of which is connected between the feedback and output terminals of the amplifier and the second impedance of which is connected between the feedback terminal of the amplifier and a reference point, a third impedance connected between the input terminal of the amplifier and the reference point, a first circuit having a fourth impedance and a first switch and connected between the input terminal of the amplifier and the reference point, and a second circuit having a fifth impedance and a second switch and connected between the feedback terminal of the amplifier and the reference point, the first and second switches being cooperated with each other so as to switch the gain and input impedance of the amplifier.

The other objects, features and advantages of the present invention will become apparent from the following description taken in conjunction with the accompanying drawings through which the like reference numerals and symbols designate the same elements with one another.

BRIEF DESCRIPTION OF THE DRAWINGS

FIG. 1 is a circuit diagram showing a prior art gain and impedance switching circuit;

FIG. 2 is a circuit diagram showing an example of the gain and impedance switching circuit for an amplifier according to the present invention; and FIG. 3 is a circuit diagram showing another example of the present invention.

DESCRIPTION OF THE PREFERRED EMBODIMENTS

An example of the gain and impedance switching circuit for use with an amplifier according to the present invention will be described hereinbelow with reference to FIG. 2 in which the reference numerals and symbols which are the same as those used in FIG. 1, represent the same elements and hence their description will be omitted, for the sake of brevity.

In FIG. 2, there is provided the feedback circuit 7 between the output and input terminals of the equalizing amplifier 5 so as to supply to the equalizing amplifier 5 such a frequency characteristic (or RIAA characteristic) that its output becomes low in a high frequency band as set forth previously. There are further provided resistors R1 and R2 which serve to switch the gain of the amplifier 5 and whose resistance values are selected, for example, at the ratio of 1:9 (by way of example, the resistance value of the resistor R1 is selected as 1 KΩ and that of the other resistor R2 is selected as 9 KΩ). The change-over switches or ON/OFF switches 2 and 3 have a pair of fixed contacts a, b and movable contacts 2c and 3c, respectively. The fixed contact b of the switch 2 is connected to one end of the input resistor r which is provided for the MC cartridge, and the other end of the resistor r is connected to the input terminal 1 and also to the input terminal of the equalizing amplifier 5 through a coupling capacitor C1. The fixed contact b of the switch 3 is connected through the resistor R1 to one end of the resistor R2 which is in turn grounded at its other end. The connection point between the resistors R1 and R2 is connected through a coupling capacitor C2 to the input terminal of the equalizing amplifier 5 and to one terminal of the feedback circuit 7. The other terminal of the feedback circuit is connected to the output terminal 6.

An operation of the switching circuit of the invention constructed as shown in FIG. 2 will be now described. When a cartridge is changed from the MM type to one of the MC type, the movable contacts 2a and 3c of the switches 2 and 3 are changed to be in contact with the fixed contacts b thereof as shown in FIG. 2, respectively. At this switched position, the input impedance to the equalizing amplifier 5 is determined by the input resistor r as about 150Ω and the gain of the amplifier 5 is determined by the ratio of the parallel composite resistance value of the resistors R1 and R2 with the resistance value of the feedback circuit 7, which gain is increased by about 20dB as compared with that of the case where only the resistor R2 is connected.

Upon carrying out the above switching, if the input impedance and the gain of the amplifier 5 are switched simultaneously, no problem will be caused. However, as the timing of this switching becomes shifted, there will be some worry that an oscillation will result in the equalizing amplifier 5. By way of example, when the cartridge is changed from the MM type to the MC type, if the gain of the amplifier 5 is switched first and thereafter the input impedance thereof is switched, there will be some worry that there will result an oscillation in the amplifier 5 till the time when the input impedance is switched due to the resonance elements of the MC cartridge and becomes low, as described previously. To avoid this oscillation, with the example of the invention shown in FIG. 2, the switches 2 and 3 are so ganged, with such a delay therebetween, that at the same time when or after the movable contact 2c of the switch 2 is switched to its fixed contact b, the movable contact 3c of the switch 3 is switched to its fixed contact b.

When the cartridge is changed from the MC type to the MM type, the movable contacts 2c and 3c of the switches 2 and 3 are switched to their fixed contacts a, respectively. Thus, the input impedance to the equalizing amplifier 5 is set as about 50 KΩ, which is determined by the resistor R and the gain thereof is set lower than the case of the MC cartridge by about 20 dB. In this case, the switches 2 and 3 are so ganged with a delay that after or at the same time when the movable contact 3c of the switch 3 is switched to its fixed contact a, the movable contact 2c of the switch 2 is switched to its fixed contact a to avoid the oscillation of the amplifier 5.

Turning to FIG. 3, another example of the invention will be described in which the same reference numerals and symbols being used as those used in FIG. 2 to designate the same elements and their description will be omitted.

With the example of the invention shown in FIG. 3, in case of switching the movable contacts 2c and 3c of the switches 2 and 3 from their fixed contacts a to b, even if the switch 3 is switched first, only the input impedance is lowered little (this is done by selecting the resistance values of resistors R1 and R2) with no increase of the gain. At the time when the switch 2 is switched and the input impedance is lowered, the gain of the amplifier is increased for the first time. Accordingly, the amplifier 5 is not brought into such a state that its input impedance is high and its gain is also high, so that no oscillation appears in the amplifier 5.

Further, in the case that the switches 2 and 3 are switched from the fixed contacts b to a contrary to the above case, even if the switch 2 is switched first, at the same time of this switching the gain of the amplifier 5 becomes low temporarily, and its input impedance becomes also low temporarily and does not become high soon. Therefore, similar to the above case, no oscillation is caused in the amplifier 5.

In the example shown in FIG. 3, the movable contact 3c of the switch 3 is directly connected to the fixed contact b of the switch 2, but the broad aspects of the present invention do not require this. That is, it is only necessary that even if the movable contact for switching the gain is switched first, only the input impedance is lowered temporarily, when the movable contact for switching the input impedance is switched, the gain is switched for the first time and that when a high input impedance and low gain condition is changed to a low input impedance and high gain condition, there is avoided a situation where a high input impedance and high gain condition appears, and hence any oscillation can be prevented from being caused in the amplifier.

It will be apparent that many modifications and variations could be effected by one skilled in the art without departing from the spirit or scope of the novel concepts of the present invention, so that the scope of the invention should be determined by the appended claims only.

What we claim as our invention is:

1. A gain and impedance switching circuit for an amplifier comprising:
   (a) an amplifier having input, feedback and output terminals;
   (b) a feedback circuit having first and second impedances, the first impedance of which is connected between the feedback terminal and the output terminal of said amplifier, and the second impedance of which is connected between said feedback terminal of said amplifier and a reference point;
   (c) a third impedance connected between the input terminal of said amplifier and said reference point;
   (d) first circuit means having a fourth impedance and a first switch and connected between the input terminal of said amplifier and said reference point; and
   (e) second circuit means having a fifth impedance and a second switch and connected between the feedback terminal of said amplifier and said reference point, said first and second switches being cooperated with each other so as to increase the gain of said amplifier as soon as the input impedance of said amplifier decreases.

2. A gain and impedance switching circuit according to claim 1, in which said first impedance of said feedback circuit has a RIAA characteristic frequency response.

3. A gain and impedance switching circuit according to claim 2, in which each of said second through fifth impedances comprise resistors.

4. A gain and impedance switching circuit according to claim 3, in which the resistance value of said third impedance is selected larger than that of said fourth impedance and the resistance value of said second impedance is selected larger than that of said fifth impedance.

5. A gain and impedance switching circuit according to claim 4, in which each of said first and second switches comprises an ON/OFF switch.

6. A gain and impedance switching circuit according to claim 5, in which the ON/OFF operation of said first and second switches has a delay therebetween.

7. A gain and impedance switching circuit according to claim 5, in which each of said first and second switches comprises a pair of fixed contacts and a movable contact, one of the pair of the fixed contacts of said second switch being connected to said fifth impedance, one of the pair of the fixed contacts of said first switch being connected to said fourth impedance and the movable contact of said second switch, respectively and the movable contact of said first switch being connected to said reference point.

8. A gain and impedance switching circuit according to claim 5, in which said first and second switches are changed-over in cooperation with each other in response to use of a moving magnet type pick-up cartridge and a moving coil type pick-up cartridge.

* * * * *